(12) United States Patent
Seidl

(10) Patent No.: US 10,811,694 B2
(45) Date of Patent: *Oct. 20, 2020

(54) FILM STRUCTURE FOR A BATTERY FOR DISPENSING ON A ROUND BODY

(71) Applicant: Schreiner Group GmbH & Co. KG, Oberschleissheim (DE)

(72) Inventor: Peter Seidl, Munich (DE)

(73) Assignee: Schreiner Group GmbH & Co. KG, Oberschleissheim (DE)

( * ) Notice: Subject to any disclaimer, the term of this patent is extended or adjusted under 35 U.S.C. 154(b) by 155 days.

This patent is subject to a terminal disclaimer.

(21) Appl. No.: 16/072,568

(22) PCT Filed: Dec. 19, 2016

(86) PCT No.: PCT/EP2016/081767
§ 371 (c)(1),
(2) Date: Jul. 25, 2018

(87) PCT Pub. No.: WO2017/129323
PCT Pub. Date: Aug. 3, 2017

(65) Prior Publication Data
US 2019/0067707 A1    Feb. 28, 2019

(30) Foreign Application Priority Data

Jan. 26, 2016    (DE) .......................... 10 2016 101 329

(51) Int. Cl.
*H01M 6/40*    (2006.01)
*G09F 3/02*    (2006.01)
(Continued)

(52) U.S. Cl.
CPC ................ *H01M 6/40* (2013.01); *G09F 3/02* (2013.01); *G09F 3/10* (2013.01); *H01M 2/26* (2013.01);
(Continued)

(58) Field of Classification Search
CPC ...... G09F 2003/0272; G09F 3/02; G09F 3/10; H01M 10/0431; H01M 2/26; H01M 6/10;
(Continued)

(56) References Cited

U.S. PATENT DOCUMENTS 5,055,968 A    10/1991  Nishi et al.
5,582,931 A *  12/1996  Kawakami .............. H01M 6/40
                                                              429/127

(Continued)

FOREIGN PATENT DOCUMENTS

DE              10313006 A1    10/2004
DE        10 2005 017682 A1    10/2006
(Continued)

OTHER PUBLICATIONS

International Search Report of PCT/EP2016/081767, dated Feb. 24, 2017.

(Continued)

*Primary Examiner* — Adam A Arciero
(74) *Attorney, Agent, or Firm* — Collard & Roe, P.C.

(57) ABSTRACT

A film structure for a battery for dispensing on a round body includes a carrier film having a first section and a subsequent second section and a first electrode layer for forming an anode or a cathode, and a second electrode layer for forming an anode, if the first electrode layer is formed as a cathode, or a cathode, if the first electrode layer is formed as an anode. The first and second electrode layers are arranged on a top side of the first section and the second section of the carrier film. While the underside of the second section of the carrier film is coated with an adhesive layer, the underside of the first section of the carrier film is free of adhesive. As a result, the first section of the carrier film can be folded over onto the second section of the carrier film during labeling and the battery can be thereby activated.

12 Claims, 2 Drawing Sheets

Figure 1:
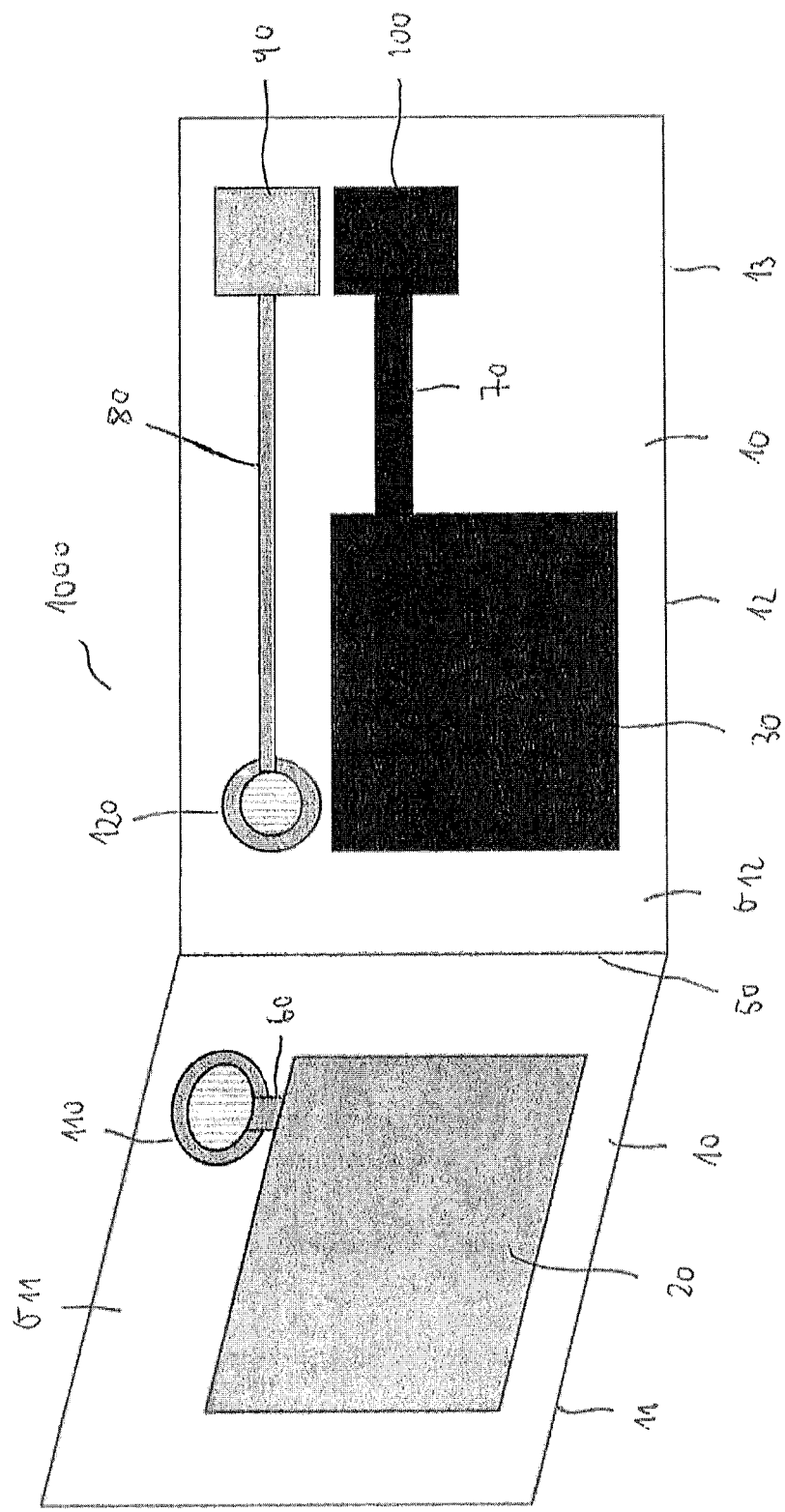

(51) Int. Cl.
*G09F 3/10* (2006.01)
*H01M 2/26* (2006.01)
*H01M 10/04* (2006.01)
*H01M 6/10* (2006.01)
*H05K 1/11* (2006.01)
*H05K 1/16* (2006.01)

(52) U.S. Cl.
CPC ......... *H01M 6/10* (2013.01); *H01M 10/0431* (2013.01); *H05K 1/118* (2013.01); *H05K 1/16* (2013.01); *G09F 2003/0272* (2013.01); *H05K 2201/055* (2013.01); *H05K 2201/10037* (2013.01)

(58) Field of Classification Search
CPC .......... H01M 6/40; H01K 1/118; H01K 1/16; H01K 2201/055; H01K 2201/10037
See application file for complete search history.

(56) References Cited

U.S. PATENT DOCUMENTS

| | | | |
|---|---|---|---|
| 6,045,942 A | 4/2000 | Miekka et al. |
| 6,136,468 A | 10/2000 | Mitchell, Jr. et al. |
| 6,379,835 B1 | 4/2002 | Kucherovsky et al. |
| 6,752,842 B2 | 6/2004 | Luski et al. |
| 6,780,208 B2 | 8/2004 | Hopkins et al. |
| 7,022,431 B2 | 4/2006 | Shchori et al. |
| 7,320,845 B2 | 1/2008 | Zucker |
| 7,776,471 B2 | 8/2010 | Kim et al. |
| 8,029,927 B2 | 10/2011 | Tucholski |
| 8,268,475 B2 | 9/2012 | Tucholski |
| 8,557,426 B2 | 10/2013 | Lee et al. |
| 2003/0036003 A1* | 2/2003 | Shchori | H01M 2/1673 429/303 |
| 2003/0099882 A1 | 5/2003 | Hampden-Smith et al. |
| 2003/0228517 A1 | 12/2003 | Holl et al. |
| 2005/0260492 A1 | 11/2005 | Tucholski et al. |
| 2010/0081049 A1 | 4/2010 | Holl et al. |
| 2010/0178551 A1 | 7/2010 | Kreutzer |
| 2011/0086260 A1 | 4/2011 | Kohlberger et al. |
| 2011/0111292 A1 | 5/2011 | Kwon et al. |
| 2012/0058378 A1 | 3/2012 | Lee et al. |
| 2014/0308574 A1 | 10/2014 | Ensling et al. |
| 2015/0136631 A1 | 5/2015 | Seidl |
| 2019/0044155 A1* | 2/2019 | Seidl | H01M 10/0431 |

FOREIGN PATENT DOCUMENTS

| | | |
|---|---|---|
| DE | 10 2008 011523 A1 | 8/2009 |
| DE | 10 2008 023571 A1 | 11/2009 |
| DE | 10 2010 018071 A1 | 10/2011 |
| DE | 10 2010 023092 A1 | 12/2011 |
| DE | 10 2012 102804 B3 | 2/2013 |
| DE | 10 2011 086899 A1 | 5/2013 |
| DE | 10 2012 104460 A1 | 11/2013 |
| EP | 0 602 976 A1 | 6/1994 |
| EP | 0 902 737 B1 | 1/2008 |
| EP | 1 359 633 B1 | 9/2009 |
| EP | 1 485 960 B1 | 6/2011 |
| EP | 2 067 193 B1 | 5/2013 |
| JP | 2007-286717 A | 11/2007 |

OTHER PUBLICATIONS

International Search Report of PCT/EP2016/081771, dated Feb. 9, 2017.

\* cited by examiner

FILM STRUCTURE FOR A BATTERY FOR DISPENSING ON A ROUND BODY

CROSS REFERENCE TO RELATED APPLICATIONS

This application is the National Stage of PCT/EP2016/081767 filed on Dec. 19, 2016, which claims priority under 35 U.S.C. § 119 of German Application No. 10 2016 101 329.3 filed on Jan. 26, 2016, the disclosure of which is incorporated by reference. The international application under PCT article 21(2) was not published in English.

The invention relates to a film structure for a battery to be dispensed onto a round body.

With the development of printed batteries, applications in which electrical functions are supposed to be accommodated on round bodies, such as auto-injectors, for example, in other words syringes having a "movable" needle, which is situated within a housing before the injection and can be moved out of the housing into the skin during the injection, by means of a suitable mechanism, vials, in other words small medication bottles, which are closed off with a rubber stopper, for example, from which a dose is withdrawn by means of a syringe and subsequently injected into the patient, bottles or similar substrates, are moving into the center point to an increasing degree. These functions include, for example, heating systems or display of the expiration of a preparation that is accommodated in the round body, for example a container, as well as indicators for use of the preparation in the round body or fill levels of a liquid that has been filled into the round body. In the case of applications in which these functions must be supported by a power source, the use of a printed battery on the surface of the round body is practical.

Printed batteries usually have a structure composed of multiple film layers, which are connected with or glued to one another at their edges. This prevents them from being laid around the surface of round bodies to be labeled, such as pens, in other words syringes having an "immovable" needle that is firmly affixed to the housing, auto-injectors, syringes, and vials, and being efficiently connected with electronic components. Instead, the individual layers of the printed battery shift relative to one another when it is bent around a round body.

Since in most cases printed batteries are what are called "closed" systems, which generally have at least one "moist" component, printed batteries can only be used on the surfaces of round bodies if they are glued very narrowly along the longitudinal direction. However, since the area size has a significant influence on the performance capacity of the battery, this is only possible for a few applications. In the case of very tight radii, printed batteries are completely eliminated for round bodies.

It is a concern of the present invention to indicate a film structure for a battery to be dispensed onto a round body, wherein the film structure can be easily and reliably applied to the round body, while guaranteeing the functionality of the battery. It is a further concern of the invention to indicate a method for activation of a film-based battery on a round body, with which the film-based battery can be easily and reliably applied to the round body, while guaranteeing the functionality of the battery.

An embodiment of a film structure for a battery that is suitable for being dispensed onto a round body is indicated in claim 1.

The film structure for a battery to be dispensed onto a round body comprises a carrier film having a first section and a subsequent second section. The second section of the carrier film is disposed behind the first section in the dispensing direction of the film structure. The film structure furthermore comprises a first electrode layer for forming an anode or a cathode. Furthermore, the film structure has a second electrode layer for forming an anode if the first electrode layer is formed as a cathode or a cathode if the first electrode layer is formed as an anode. The first electrode layer is disposed on a top side of the first section of the carrier film. The second electrode layer is disposed on a top side of the second section of the carrier film, at a distance from the first electrode layer. The first section of the carrier film is configured to be free of adhesive on its underside. In contrast, the second section of the carrier film is coated with an adhesive layer on its underside.

In the case of the film structure indicated above, for implementation of a battery that is suitable for being dispensed onto a round body, it is not necessary to dispose all the components, that is, in particular, the first and the second electrode layer, on a single side of the film structure. The freedom from tension when the film structure is wound around a round body to be labeled, as well as the activation of the actual battery cell of the film structure, occur when the first leading section of the carrier film is laid around onto the second section of the carrier film during the dispensing process. A label produced in this manner, having the first and second electrode layer as battery components, can run into a dispensing machine with which the round body is labeled.

According to a possible embodiment, the first section of the carrier film extends approximately on the first third of the label or of the film structure. The first section of the carrier film has a length that corresponds maximally to the circumference of the container to be labeled. Since the first section of the carrier film is not configured to be adhesive on its underside, it does not form a connection with the body to be labeled, during the dispensing process. The first section of the carrier film at first stands away from the round body to be labeled, like a pennant. The second section of the carrier film, which now follows during dispensing, adheres to the surface of the round body. The length of the second section of the carrier film corresponds to the circumference of the round container to be labeled. After the second section of the carrier film has been glued onto the round body, a third section of the carrier film follows, subsequent to the second section.

The third section of the carrier film is also coated with the adhesive layer on its underside. Further winding of the adhesively configured third section of the carrier film around the round body brings about the result that the leading first section of the carrier film is folded over when the third section of the carrier film reaches the spot at which the first section of the carrier film borders on the second section of the carrier film.

The first electrode layer and the second electrode layer are disposed at respective positions on the first and the second section of the carrier film, in such a manner that the first and second electrode layer, as current-forming parts of the film-based battery, come into contact with one another when the first section of the carrier film is folded over onto the second section of the carrier film. The battery is activated to generate a voltage, by means of the electrical contact formed between the first and second electrode layer.

The film structure is configured in such a manner that the first and the second electrode layer are disposed next to and at a distance from one another on the same side of the carrier film. A bending line or fold, which is configured as a perforation/partial perforation, for example, can be disposed between the first and the second section of the carrier film. The bending line makes it possible that the first section of the carrier film is laid around the second section of the carrier film during labeling, congruent with it, by means of the third section that is laid on top of it.

One of the first and second electrode layers can be coated with an electrolyte layer, by means of which an ion stream is made possible between the first and second electrode layer in the activated state of the battery, when the first section of the carrier film is folded over onto the second section of the carrier film, so that the first section of the carrier film lies on the second section of the carrier film. As a result, the film-based printed battery is activated to issue a voltage only during the labeling process. In the folded-up state before label application, the film structure can be covered with a slightly adhesive film. Optionally, the electrolyte layer can also be applied at a later point in time, for example by means of a metering device, so as to connect the film structure with electronic components prior to that.

According to a possible embodiment, the first section of the carrier film is essentially free of adhesive on its underside. To support production and subsequent work processes, individual adhesive points can be situated on the underside of the first section of the carrier film, which points do not, however, hinder the later function of folding the first section of the carrier film over onto the second section of the carrier film.

An embodiment of a method for activation of a film-based battery on a round body is indicated in claim 13. The method comprises making available a film structure for a battery according to one of the embodiments indicated above, in particular according to one of the embodiments indicated in claims 1 to 12.

According to the method, the film structure is applied/dispensed onto the round body in such a manner that the second section of the carrier film adheres to the round body on its underside, and the first section of the carrier film is folded over onto the second section of the carrier film. By means of placing the first electrode layer over the second electrode layer so as to be congruent with it, the battery is activated when the first section of the carrier film is folded over onto the second section of the carrier film.

The configuration of the film structure for implementation of the battery to be dispensed onto the surface of a round body to be labeled, as well as the method for activation of a film-based battery on the round body will be graphically explained in greater detail below, using figures.

Figure 2:
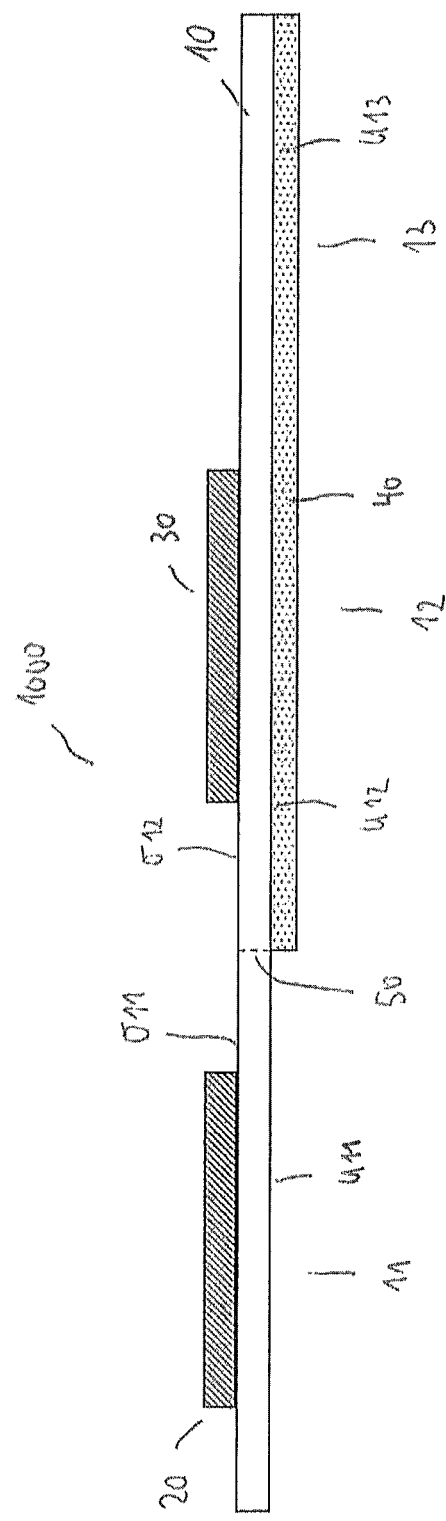

These show:

FIG. 1 a perspective view of an embodiment of a film structure for a battery to be dispensed onto a round body, and FIG. 2 a cross-section through an embodiment of a film structure for a battery to be dispensed onto a round body.

FIGS. 1 and 2 show a perspective view and a cross-section, respectively, of an embodiment of a film structure 1000 for implementation of a battery, which is suitable, in particular, for being dispensed onto a surface of a round body. The film structure 1000 comprises a carrier film 10 having a first section 11 and a subsequent second section 12. The second section 12 is disposed behind the first section 11 in the dispensing direction.

The film structure 1000 furthermore comprises a first electrode layer 20 for forming an anode or a cathode. Furthermore, the film structure comprises a second electrode layer 30 for forming an anode if the first electrode layer 20 is formed as a cathode or, respectively, acts as a cathode in the activated state of the film-based battery, or a cathode if the first electrode layer 20 is formed as an anode or, respectively, acts as an anode in the activated state of the film-based battery.

The first electrode layer 20 is disposed on a top side O11 of the first section 11 of the carrier film 10. The second electrode layer 30 is disposed on a top side O12 of the second section 12 of the carrier film 10, at a distance from the first electrode layer 20. The first section 11 of the carrier film 10 is configured to be free of adhesive on its underside U11. The second section 12 of the carrier film 10 is coated with an adhesive layer 40 on its underside U12.

For reasons of a simplified representation, only the first and the second electrode layer 20 and 30 are shown in FIGS. 1 and 2. An electrolyte layer 120 is disposed on one of the first and the second electrode layers 20, 30. The electrolyte of the electrolyte layer is a medium that makes an ion stream possible between the first and the second electrode layer 20, 30 in the state of the activated battery, when the first section 11 of the carrier film lies on the second section 12 of the carrier film due to having been folded over, and the first electrode layer lies on the second electrode layer, congruent with it.

According to one embodiment, a separator, not shown in FIGS. 1 and 2, can be printed onto one of the electrode layers, in order to prevent the first electrode layer 20 from lying directly on the second electrode layer 30. The separator has a lattice structure and/or a point structure and/or a honeycomb structure and/or a cross-hatching, for example, and holds the first and the second electrode layer 20, 30 at a defined distance from one another in the state in which they are folded one on top of the other, so that a short-circuit between the first and second electrode layer is prevented. The electrolyte can fill the spaces between the first and second electrode layers that are not already covered by the separator. It should be noted, however, that the battery also functions without a separator if the electrolyte layer is disposed between the electrodes.

Since the first section 11 of the carrier film 10 is not coated with the adhesive layer 40 on its underside U11, the film structure 1000 is configured in such a manner that the first section 11 of the carrier film 10 at first stands away from the round body like a pennant when the film structure is dispensed onto the round body, while the second section 12 of the carrier film adheres to the round body with its adhesive-coated underside U12.

The carrier film 10 has a third section 13 that follows the second section 12 in the dispensing direction. The film structure 1000 is configured in such a manner that the first section 11 of the carrier film is folded over onto the second section 12 of the carrier film, during dispensing of the film structure onto the round body, when the second section 12 of the carrier film adheres to the round body with its adhesive-coated underside U12 during dispensing onto the round body, and the third section 13 of the carrier film is wound around the round body. When the third section 13 of the carrier film 10 runs up onto a bending line/fold 50 between the first and the second section of the carrier film, the third section 13 of the carrier film folds the first section 11 of the carrier film over by 180° onto the second section 12 of the carrier film. The film structure 1000 is particularly configured in such a manner that the first section 11 of the carrier film is folded over onto the top side O12 of the second section 12 of the carrier film with its top side O11 when the film structure is dispensed onto the round body.

In order for the first electrode layer 20 to be disposed on the second electrode layer 30 so as to be congruent with it when the first section 11 of the carrier film 10 is folded over onto the second section 12 of the carrier film, the first electrode layer 20 is disposed on the first section 11 of the carrier film at a first position, and the second electrode layer 30 is disposed on the second section 12 of the carrier film at a second position. The two positions lie at a distance from one another, in such a manner that the second electrode layer 30 is disposed above the first electrode layer 20, congruent with it, when the first section 11 of the carrier film is folded over onto the second section 12 of the carrier film during dispensing of the film structure onto the round body.

The third section 13 of the carrier film has the adhesive layer 40 on its underside U13, which layer also extends, proceeding from the underside U12 of the second section of the carrier film, to the underside U13 of the third section 13 of the carrier film. The film structure 1000 is configured in such a manner that the third section 13 of the carrier layer is pressed against the underside U11 of the folded-over first section 11 of the carrier film with the adhesive layer 40 disposed on its underside U13 when the second section 12 of the carrier film adheres to the round body with its underside U12, and the third section 13 of the carrier film 10 is wound around the round body during dispensing onto the round body.

As shown in FIG. 1, one of the first and the second sections 11, 12 of the carrier film can have a bending line/fold 50 at the boundary where the first section 11 of the carrier film borders on the second section 12 of the carrier film. The bending line/fold 50 can be a weakening line, for example, in particular a perforation or partial perforation. The first and the second electrode layer 20, 30 are disposed on the first and the second section 11, 12 of the carrier film symmetrically relative to the bending line/fold 50, so that when the film structure is folded at the bending line/fold 50, the first electrode layer 20 is disposed on the second electrode layer 30, congruent with it.

According to one embodiment, the film structure 1000 can have a first conductor track 60 for conducting a current to/from the first electrode layer 20. The first conductor track 60 is disposed on the top side O11 of the first section 11 of the carrier film 10. Furthermore, the film structure can have a second conductor track 70 for conducting a current to/from the second electrode layer 30. The second conductor track 70 is disposed on the top side O12 of the second section 12 of the carrier film 10.

Furthermore, the film structure can have a third conductor track 80, which is disposed on the top side O12 of the second section 12 of the carrier layer 10. For tapping a voltage that is made available by the film-based battery in the activated state, the film structure 1000 has a first connection surface 90, which is connected with the third conductor track 80, as well as a second connection surface 100, which is connected with one end of the second conductor track 70.

According to a possible embodiment, the film structure 1000 has a first electrically conductive contact surface 110 and a second electrically conductive contact surface 120. The first conductor track 60 is connected with the first electrode layer 20 with a first end, and with the first contact surface 110 with a second end. The first contact surface 110 is disposed on the top side O11 of the first section of the carrier film. The second contact surface 120 is disposed on the top side O12 of the second section 12 of the carrier film, in such a manner that the first contact surface 110 is disposed on the second contact surface 120 when the first section 11 of the carrier film is folded over onto the second section 12 of the carrier film during dispensing of the film structure onto the round body.

As a result, a current flow can be transferred from the first electrode layer 20, by way of the conductor track 60, to the first contact surface 110, and from there, by way of the second contact surface 120, to the second section 12 of the carrier film. Thereby a voltage that is supplied by the battery in the activated state can be tapped on one side, namely on the top side O12 of the second section 12 of the carrier film 10.

According to a possible embodiment, the first and the second contact surface 110, 120 can each have a dry adhesive and a conductive material. A dry adhesive is an adhesive that adheres only to itself. In this embodiment, the respective conductive material of the first and the second contact surface 110, 120 is disposed on the respective dry adhesive of the first and second contact surface.

When the first section 11 of the carrier film is folded over onto the second section 12 of the carrier film during dispensing of the film structure onto the round body, the first and the second contact surface 110, 120 lie congruently on one another. The dry adhesive of the first contact surface 110 adheres to the dry adhesive of the second contact surface 120 due to the press-down pressure that is exerted on the first section 11 of the carrier film by the third section 13 of the carrier film. As a result, the conductive material of the first contact surface 110 is electrically contacted with the conductive material of the second contact surface 120.

With the film structure indicated, an activatable battery is made available, which at first has two inactive current-forming surfaces 20 and 30, which lie next to one another on a common side, in particular the top side O11, O12 of two adjacent sections of a carrier film. The battery is activated only at the time point of label application, by folding the first section 11 over onto the second section 12 of the carrier layer, in that the first electrode layer 20 is disposed congruently on the second electrode layer 30.

Folding the first section 11 of the carrier film over onto the second section 12 of the carrier film takes place when the third section 13 of the carrier film runs up onto the bending line/fold 50 between the first and the second section of the carrier film during application of the film structure onto a round body to be labeled. The two electrode layers can be separated from one another by an electrolyte layer that makes the ion stream possible, and optionally by a separator. The first electrode layer 20 and the second electrode layer 30 are brought into contact with one another, in tension-free manner, by means of folding the first section 11 of the carrier film over onto the second section 12 of the carrier film, transverse to the running direction, and the battery cell is activated.

By means of the film structure indicated, it is possible to equip bodies having tight radii with printed batteries in the form of the film structure indicated. The current-forming surfaces can fundamentally be infinitely large, but in any case greater than the circumference of the body to be labeled. In particular, the size of the current-forming surfaces/electrode surfaces is not dependent on the circumference of the body to be labeled. Ideally, however, the size of the surfaces of the electrode layers should not exceed the outer surface area of the body to be labeled.

REFERENCE SYMBOL LIST 10 carrier film
20 first electrode layer
30 second electrode layer
40 adhesive layer
50 bending line/fold 60 first conductor track
70 second conductor track
80 third conductor track
90 connection surface
100 connection surface
110 first contact surface
120 second contact surface
1000 film structure

The invention claimed is:

1. A film structure for a battery to be dispensed onto a round body, comprising:
    a carrier film (10) having a first section (11) and a subsequent second section (12),
    a first electrode layer (20) for forming an anode or a cathode,
    a second electrode layer (30) for forming an anode if the first electrode layer (20) is formed as a cathode or a cathode if the first electrode layer (20) is formed as an anode
    wherein the first electrode layer (20) is disposed on a top side (O11) of the first section (11) of the carrier film,
    wherein the second electrode layer (30) is disposed on a top side (O12) of the second section (12) of the carrier film (10), at a distance from the first electrode layer (20),
    wherein the first section (11) of the carrier film (10) is configured to be free of adhesive on its underside (U11),
    wherein the second section (12) of the carrier film (10) is coated with an adhesive layer (40) on its underside (U12).

2. The film structure according to claim 1,
    wherein the film structure (1000) is configured in such a manner that the first section (11) of the carrier film stands away from the round body during dispensing of the film structure onto the round body, and the second section (12) of the carrier film adheres to the round body with its underside (U12).

3. The film structure according to claim 1,
    wherein the carrier film (10) has a third section (13) that follows the second section (12),
    wherein the film structure (1000) is configured in such a manner that the first section (11) of the carrier film is folded over onto the second section (12) of the carrier film, during dispensing of the film structure onto a round body, when the second section (12) of the carrier film adheres to the round body with its underside (U12) during dispensing of the film structure onto the round body, and the third section (13) of the carrier film is wound around the round body.

4. The film structure according to claim 3,
    wherein the film structure (1000) is configured in such a manner that the first section (11) of the carrier film is folded over, with its top side (O11), onto the top side (O12) of the second section (12) of the carrier film during dispensing of the film structure onto the round body.

5. The film structure according to claim 3,
    wherein the first electrode layer (20) is disposed on the first section (11) of the carrier film at a first position, and the second electrode layer (30) is disposed on the second section (12) of the carrier film at a second position, at a distance from one another, in such a manner that the second electrode layer (30) is disposed above the first electrode layer (20) when the first section (11) of the carrier film is folded over onto the second section (12) of the carrier film during dispensing of the film structure onto the round body.

6. The film structure according to claim 5,
    wherein the third section (13) of the carrier film has the adhesive layer (40) on its underside (U13).

7. The film structure according to claim 6,
    wherein the film structure (1000) is configured in such a manner that the third section (13) of the carrier layer is pressed against the underside (U11) of the folded-over first section (11) of the carrier film with the adhesive layer (40) disposed on its underside (U13) when the second section (12) of the carrier film adheres to the round body with its underside (U12), and the third section (13) of the carrier film is wound around the round body during dispensing onto the round body.

8. The film structure according to claim 1,
    wherein one of the first and the second sections (11, 12) of the carrier film has a bending line (50) at the boundary at which one of the first and the second sections (11) of the carrier film borders on the other of the first and second sections (12) of the carrier film.

9. The film structure according to claim 8,
    wherein the first and the second electrode layer (20, 30) are disposed on the first and second section (11, 12) of the carrier film, symmetrical to the bending line (50).

10. The film structure according to claim 1, comprising:
    a first conductor track (60) for conducting a current from/to the first electrode layer (20), wherein the first conductor track (60) is disposed on the top side (O11) of the first section (11) of the carrier film,
    a second conductor track (70) for conducting a current from/to the second electrode layer (30), wherein the second conductor track (70) is disposed on the top side (O12) of the second section (12) of the carrier film.

11. The film structure according to claim 10, comprising:
    a first contact surface (110), wherein the first conductor track (60) is connected with the first electrode layer (20) with a first end, and with the first contact surface (110) with a second end,
    a second contact surface (120) which is disposed on the top side (O12) of the second section (12) of the carrier film, in such a manner that the first contact surface (110) is disposed on the second contact surface (120), and thereby a current is transferred from the first contact surface (110) on the first section (11) of the carrier film to the second contact surface (120) on the second section (12) of the carrier film, when the first section (11) of the carrier film is folded over onto the second section (12) of the carrier film during dispensing of the film structure onto the round body.

12. The film structure according to claim 11,
    wherein the first and second contact surface (110, 120) each have a dry adhesive and a conductive material, wherein the respective conductive material of the first and second contact surface (110, 120) is disposed on the respective dry adhesive of the first and second contact surface,
    wherein the dry adhesive of the first contact surface (110) adheres to the dry adhesive of the second contact surface (120), and the conductive material of the first contact surface (110) is electrically contacted with the conductive material of the second contact surface (120) when the first section (11) of the carrier film is folded over onto the second section (12) of the carrier film during dispensing of the film structure onto the round body.

* * * * *